United States Patent [19]

Golla et al.

[11] Patent Number: 5,594,677
[45] Date of Patent: Jan. 14, 1997

[54] METHOD AND APPARATUS FOR FILTERING HIGH RESOLUTION DIGITAL SIGNALS

[75] Inventors: Carla Golla, Sesto San Giovanni; Alessandro Cremonesi, S. Angelo Lodigiano, both of Italy

[73] Assignee: SGS-Thomson Microelectronics S.r.l., Agrate Brianza, Italy

[21] Appl. No.: 189,271

[22] Filed: Jan. 28, 1994

[30] Foreign Application Priority Data

Jan. 29, 1993 [EP] European Pat. Off. .............. 93830031

[51] Int. Cl.$^6$ .................................................. G06F 17/10
[52] U.S. Cl. ...................................................... 364/724.16
[58] Field of Search ......................... 364/724.16, 724.13, 364/724.01

[56] References Cited

U.S. PATENT DOCUMENTS

| | | | |
|---|---|---|---|
| 4,484,299 | 11/1984 | Lambourn et al. | 364/724.16 |
| 4,649,507 | 3/1987 | Inabe et al. | 364/724.16 |
| 4,703,447 | 10/1987 | Lake, Jr. | 364/724.16 |
| 4,792,915 | 12/1988 | Adams et al. | 364/724.19 |
| 4,872,127 | 10/1989 | Nolan | 364/724.08 |
| 5,016,207 | 5/1991 | Fujii et al. | 364/724.01 |
| 5,081,604 | 1/1992 | Tanaka | 364/724.16 |
| 5,339,264 | 8/1994 | Said et al. | 364/724.16 |
| 5,379,242 | 1/1995 | Rose et al. | 364/724.01 |
| 5,388,062 | 2/1995 | Knutson | 364/724.16 |
| 5,392,230 | 2/1995 | Christopher | 364/724.13 |

FOREIGN PATENT DOCUMENTS

| | | | |
|---|---|---|---|
| 0494696 | 7/1992 | European Pat. Off. | H04L 27/20 |
| WO92/11696 | 12/1991 | WIPO | H03H 17/02 |

OTHER PUBLICATIONS

Patent Abstract of Japan, vol. 16, No. 67 (E-1168), Feb. 19, 1992, JP-A-3261213 (Matsushita), Nov. 21, 1991.
Patent Abstract of Japan, vol. 9, No. 16 (P-329) Jan. 23, 1985 JP-A-59162471 (Hitachi), Sep. 13, 1984.

*Primary Examiner*—David H. Malzahn
*Attorney, Agent, or Firm*—David M. Driscoll; James H. Morris

[57] ABSTRACT

The input signal is filtered using at least two filtering operations (i.e. at least two types of transfer functions), and then is reconstituted by summing the two different digital outputs generated by each filtering arrangement, for example by using a summing circuit. In a preferred embodiment of the invention, a single programmable filter processor is used and is operated in two alternately selected modes, each sharing common filter coefficients. A clock signal alternately selects the two filtering modes. The subsequent outputs from a first mode are delayed and then added to the output of the second mode to produce the desired output signal.

8 Claims, 7 Drawing Sheets

METHOD AND APPARATUS FOR FILTERING HIGH RESOLUTION DIGITAL SIGNALS

BACKGROUND OF THE INVENTION

A digital filter is a device which converts an input sampled signal into another sampled, output signal having predetermined frequency response characteristics. A sampled signal is understood to mean a digital signal encoded by a predetermined natural number N of bits. The number N determines the accuracy or resolution of the filter.

Digital filters are used primarily in digital oscilloscopes, spectrum analyzers, and audio and video signal processors. Their use is ever-expanding, due to the many advantages that they afford over corresponding analog filters. For example, for the same function, digital filters allow very narrow transmission bands to be achieved and are also more stable, both over time and with respect to variations in power supply and operating temperature, than analog filters.

It is current practice to implement digital filters in the form of an integrated circuit using digital multipliers and adders. Digital multipliers may be arranged to include a non-volatile memory structure of the so-called "look-up table" type, wherein the products of the input sample signals and the filter transfer function coefficients are stored.

Figure 2:
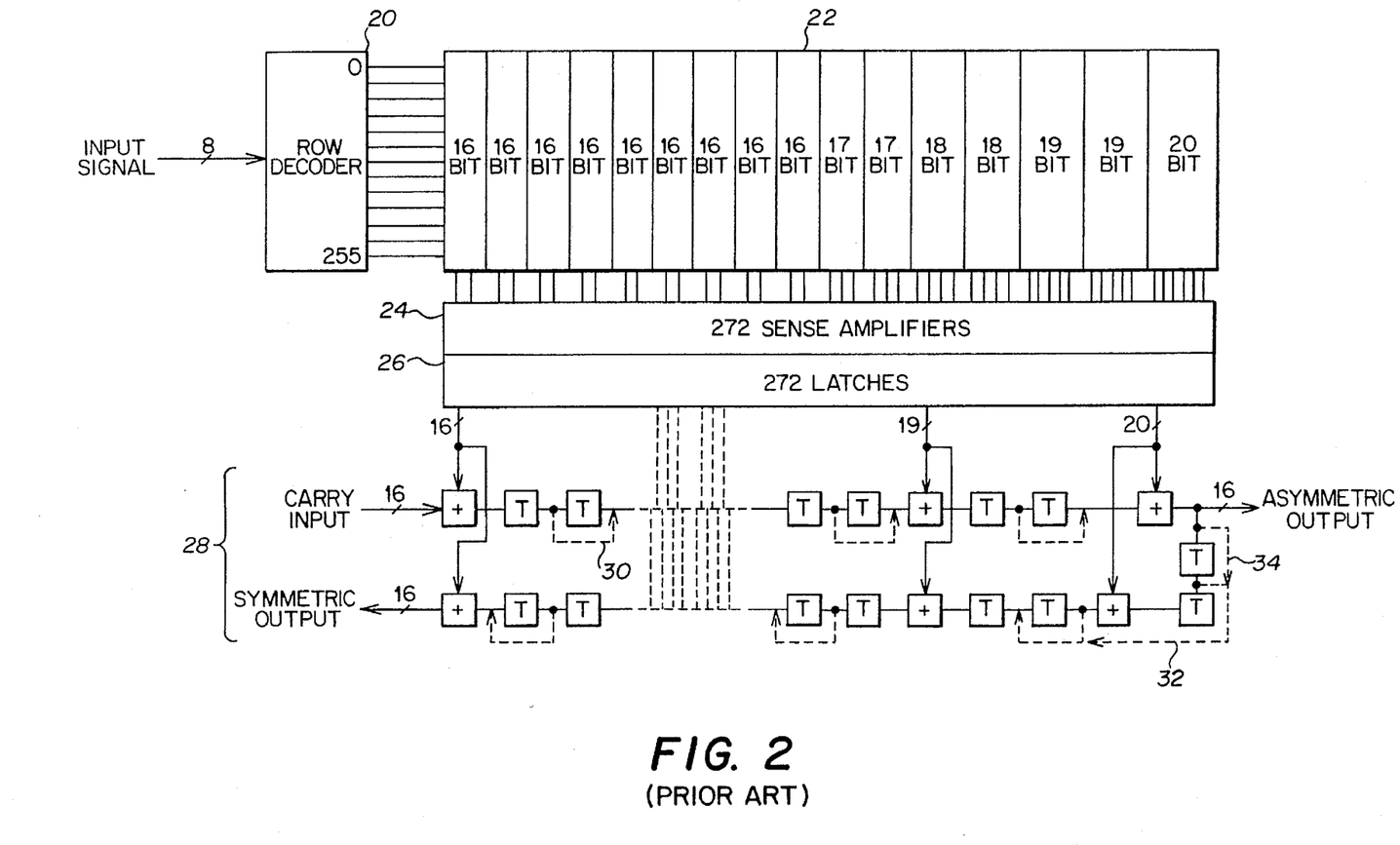
FIG. 2 shows a programmable filter processor (PFP) filter in block diagram form.

An example programmable filter processor (PFP) embodying such a memory structure is shown in FIG. 2 and is described in detail, for example, in "30-MSamples/s Programmable Filter Processor", *IEEE Journal of Solid-State Circuits*, Vol. 25, No. 6, December 1990, pp. 1502–1509. The memory structure shown in FIG. 2 includes a row decoder 20 which decodes the input signal to locate the appropriate partial products for that input signal in the memory 22. The output of the memory 22 is fed to sense amplifiers 24 and latches 26. The output of these latches are fed to an adder and delay structure 28. The adder and delay structure 28 includes some programmable elements, around which paths are indicated by dashed lines, such as items indicated by reference numerals 30, 32, and 34 which allow for programmability of the type of filter operation to be performed.

Figure 1:
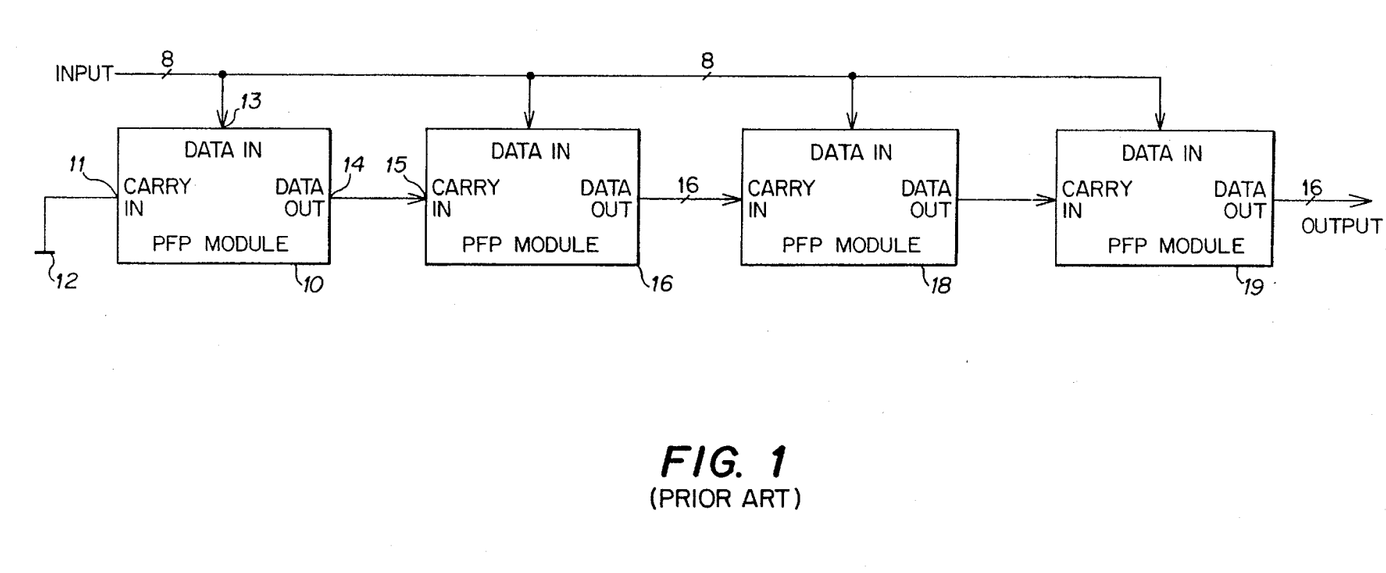
FIG. 1 is a block diagram which illustrates a method of filtering digital signals according to the prior art.

Because there is a limit on the number of filter coefficients that can be held in any physical embodiment of such as memory structure, two or more PFPs are often needed in practical applications. For such applications, each programmable filter processor can be cascaded with other similar PFPs in a manner as shown in FIG. 1. In FIG. 1, a first PFP module 10 has its carry inputs 11 attached to ground 12 and its data inputs 13 attached to receive the input signal. Its data outputs 14 are attached to the carry inputs 15 of a subsequent PFP module 16. All other PFP modules 18 and 20 are similarly connected, and the last PFP module in the chain provides the output sampled signal.

While being in many ways advantageous, this prior approach to filtering high-resolution digital signals using such filters still has the following drawback.

If "n" is the number of bits used to sample the input signal, "N" is the overall number of the filter coefficients, and "p" is the number of bits required for storing a product of an sample by a filter coefficient, then the memory size is found to be $2^n Np$. Clearly, each additional bit used to represent the sampled input signal, in order to increase the filter resolution, doubles the required size of the memory. The prior art has failed to bring forth any useful solution to obviate the need for such memory expansion when improved filter accuracy or resolution is sought.

SUMMARY OF THE INVENTION

To overcome this problem with the prior art, the input signal is filtered using at least two filtering operations (i.e. at least two types of transfer functions), and then is reconstituted by summing the two different digital outputs generated by each filtering arrangement, for example by using a summing circuit.

In a preferred embodiment of the invention, a single programmable filter processor is used and is operated in two alternately selected modes, each sharing common filter coefficients. A clock signal alternately selects the two filtering modes. The subsequent outputs from a first mode are delayed and then added to the output of the second mode to produce the desired output signal.

BRIEF DESCRIPTION OF THE DRAWING

The features and advantages of the method and apparatus of this invention will become more clearly apparent from the following detailed description of an exemplary, non-limiting embodiment thereof, given with reference to the accompanying drawing, in which.

DETAILED DESCRIPTION

The present invention will be more completely understood through the following detailed description which should be read in conjunction with the attached drawing in which similar reference numbers indicate similar structures. All references cited herein are hereby expressly incorporated by reference.

Figure 5:
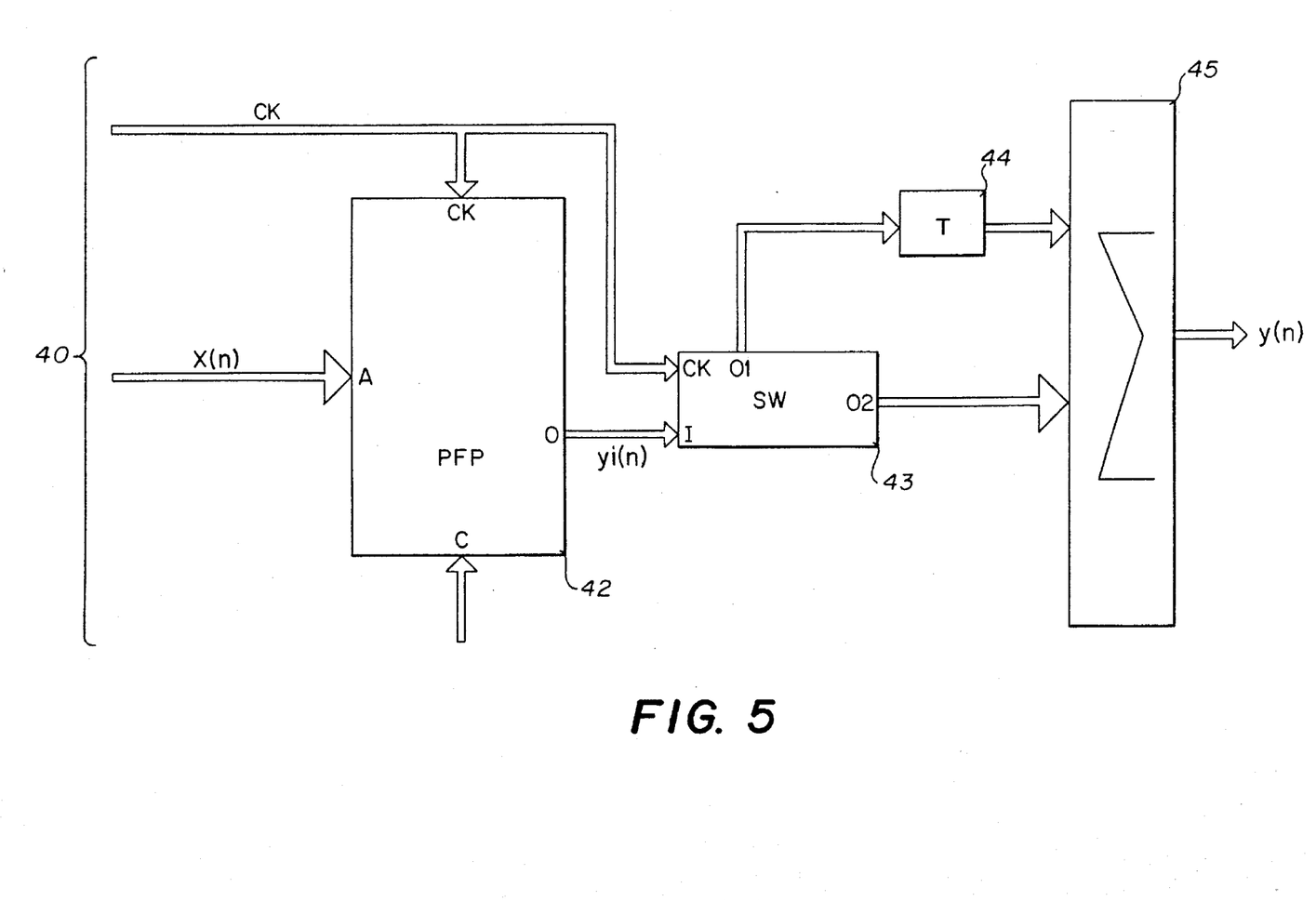
FIG. 5 is a block diagram of a first embodiment of a digital filter architecture according to the invention.

FIG. 5 shows a digital filter architecture 40 embodying this invention and being effective to enable high-resolution filtering of digital signals having a high dynamic range, such as video signals, using a narrow band filter 42.

This architecture 40 in the preferred embodiment is adapted to operate with input digital signals x(n) which are encoded with at least 7 bits. The architecture 40 comprises a predetermined number of narrow-band programmable filter processors, denoted by the acronym PFP. Such a filter 42 has a well-known structure and is described, for example, in "30-MSamples/s Programmable Filter Processor", *IEEE Journal of Solid-State Circuits*, Vol. 25, No. 6, December 1990, pp. 1502–1509. Such a structure is also described in Italian Patent Application Nos. 22954-A/88, and 22890-A/88 and European patent application 92830177.9 filed Apr. 10, 1992, and in corresponding U.S. Pat. No. 5,053,984, U.S. Pat. No. 5,103,416, and U.S. patent application Ser. No. 08/045,384 filed Apr. 9, 1993, respectively, all of which are commonly assigned to the assignee of this application and are hereby expressly incorporated by reference. Therefore detailed explanation is omitted here. Each filter 42 receives as its input an input digital signal x(n) and outputs another digital signal having predetermined frequency response characteristics.

The filter 42 is preferably a non-recursive, linear-phase Finite Impulse Response (FIR), which means that, at each discrete time, the input digital signal x(n) and the output digital signal y(n) are related by the following equation:

$$y(n) = \sum_{i=0}^{N-1} a(i)*x(n-i) \quad (1)$$

Thus, each output sample y(n) is only dependent on present and past input samples. There is a finite natural number N of filter coefficients a(i) which are determined by the impulse response of the filter. The filter 42 may also be described by a transfer function H(z), expressed as a function of a complex variable z and defined as the ratio H(z) of the transform Z of a sequence of output sampled signals y(nT) to the transform Z of a sequence of input sampled signals x(nT) as is well known in the art. The synthesis at circuit level of that transfer function practically enables implementation of the filter 42 as a single PFP integrated circuit, whereby for each digital input digital signal x(n), an output digital signal y(n) given by equation (1) would be produced.

The inputs of the filter 42 which receive the input digital signal x(n) are designated A, and the digital outputs are designated O. Advantageously, the architecture 40 includes a number m of filters 42 given by:

$$m = 2^{(d-n+1)} \quad (2)$$

where, d is the number of bits in the input signal, and n is the number of input bits to the filter 42.

To exemplify this invention, reference is made to a presently preferred, but not limiting, embodiment of the filter 42, it being understood that changes may be made thereto which are still within the scope of the present invention. The architecture of the preferred filter 42, as described in the aforementioned literature has the capability to handle a digital signal quantized in accordance with different transfer functions to be selected by means of a signal applied to an input C of the filter 42.

In the embodiment shown in FIG. 5, seven-bit input signals are considered for an 8-bit input. It is clear from formula (2) that a single filter 42 is required, whereas four are needed in the prior art of FIG. 1. The input digital signal x(n) is applied to the input A of the filter 42. The filter 42 outputs a 16-bit output digital signal yi(n) which is applied to an input of a switch 43. The characteristic of the output digital signal yi(n), derived directly from the features of the filter 42 in its present embodiment, is obtained by alternately representing the transform provided by first and second filtering selections for the programmable filter processor 42.

Figure 3:
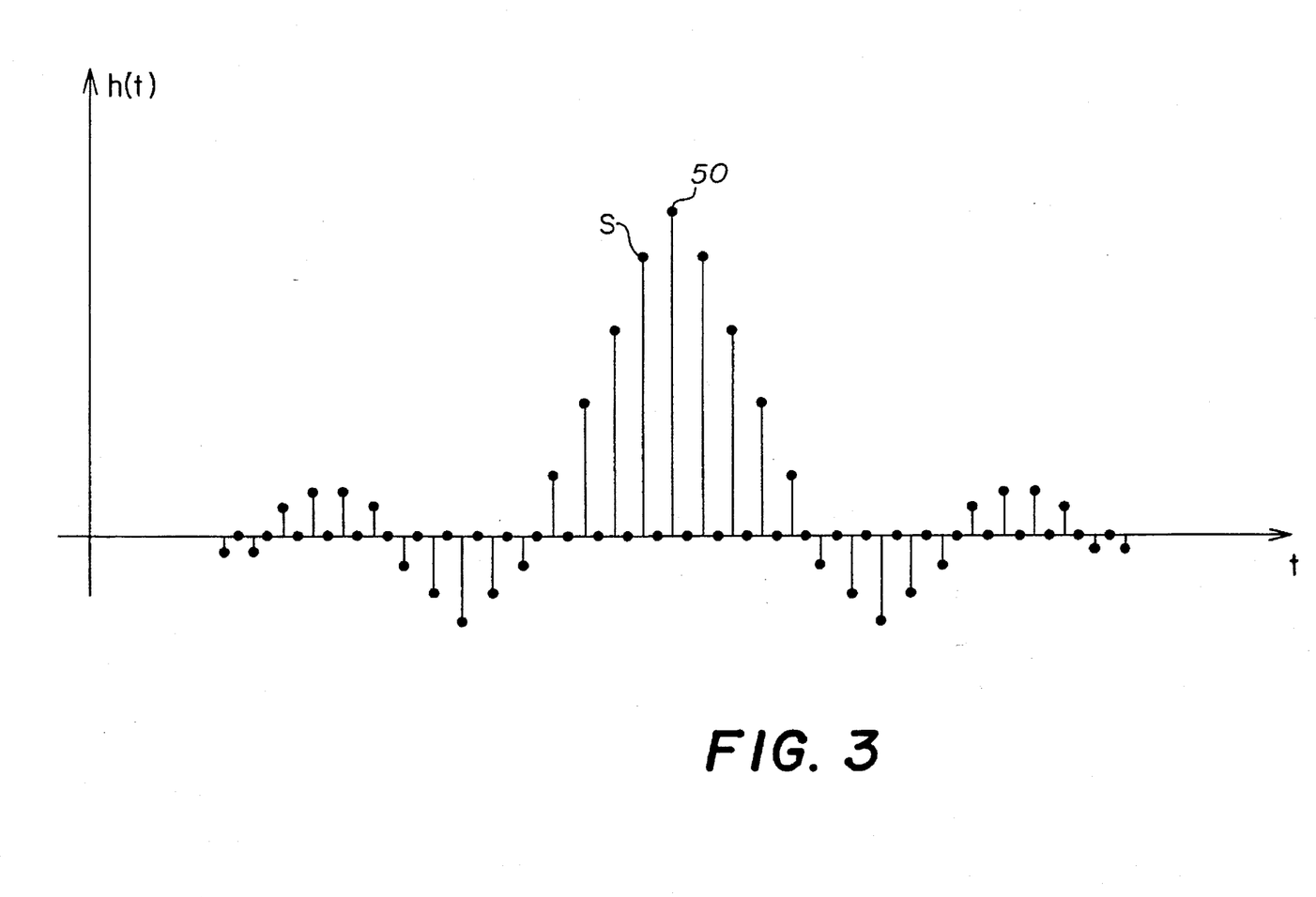
FIG. 3 shows the impulse response of the filter in FIG. 2, for a first transfer function.
Figure 4:
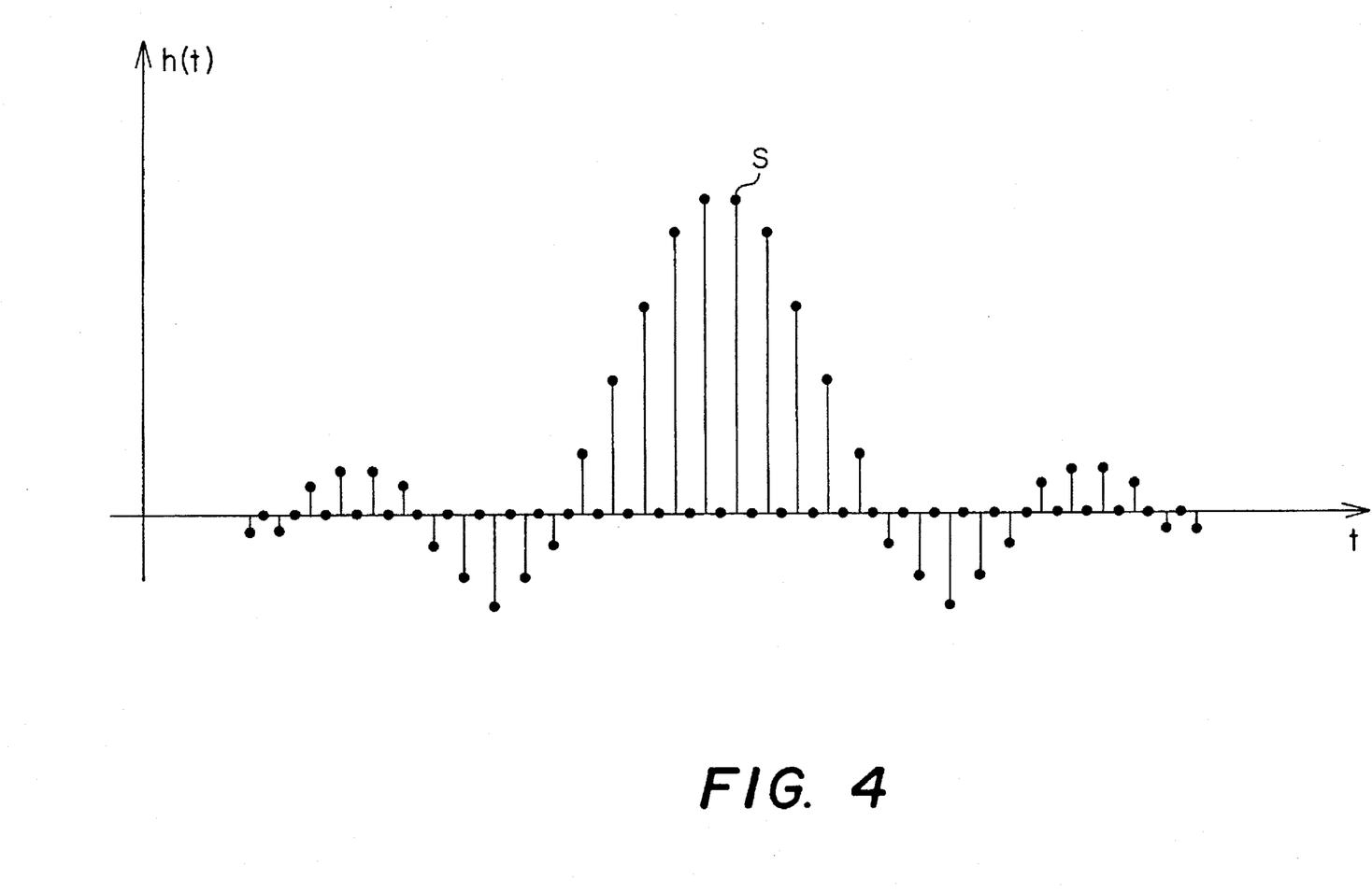
FIG. 4 shows the impulse response of the filter in FIG. 2, for a second transfer function.

Such filtering selection is enabled the processor discussed in the references cited above. In connection with the preferred embodiment, these preferred filtering selections are referred to herein as type 6 and type 7 filters. FIGS. 3 and 4 show preferred first and second filter transfer functions which may be used in a filter structure such as shown in FIG. 2. FIG. 3 represents a first filtering selection (type 6) having a transfer function of an even symmetric FIR filter which has a center tap and corresponding middle, or central, coefficient 50 in the time domain t with every other coefficient set to zero. Each coefficient has a valve h(t). The significant samples are the non-zero samples S; null valued samples are inserted between these coefficients and correspond other taps in a filter. FIG. 4 similarly shows an even symmetric FIR filter without a middle or central coefficient, i.e., having a zero or null value for the center tap, and every other coefficient set to zero.

For the first and second filtering selections, the output digital signal yi(n) of the PFP 42 can be represented by the following formulae, respectively:

$$y6(n) = \sum_{i=0}^{N-1} a6(i)*x(n-i) \quad (3)$$

$$y7(n) = \sum_{i=0}^{N-1} a7(i)*x(n-i) \quad (4)$$

The switch 43 is assigned the task of applying the signal yi(n) from the PFP module 42 alternatively to the adder 45 and the delay block 44. The latter introduces a time delay equal to the time required by the filter 42 to process the signal by either of the first and second filtering selections. Thus, the adder 45 is assigned the task of reconstituting the final output signal y(n) by summing together the signals yi(n) as generated from the signal x(n) itself and transformed by the first and second filtering selections, respectively. A clock signal CK is used both for switching between the first and second filtering selections and for driving the switch 43.

The output digital signal y(n) from adder 45 represents the overall filter transfer function as shown by formula (5) below:

$$y(n) = \sum_{i=0}^{N-1} a(i)*x(n-i) = y6(n) + y7(n) \quad (5)$$

with a number of significant values equal to the sum of the significant values of each of the two transfer functions.

In the example being considered, for a symmetric signal processed through the present embodiment of the filter 42, 63 significant values can be obtained using a single filter 42. Notice that the prior art would normally allow the generation of no more than 32 significant coefficients (type 6 allows 31 coefficients; type 7 allows for 32), in the example of FIG. 1 where a seven-bit input signal x(n) has been selected for 8-bit input filters, whereas according to formula (2), only one filter 42 is employed in accordance with the invention.

The architecture and method described in the foregoing are specially advantageous where the input digital signal x(n) is encoded with seven bits and the filter has an 8-bit input. In that case, a single PFP filter would be sufficient to provide a high degree of accuracy in filtering within a very short time.

Figure 6:
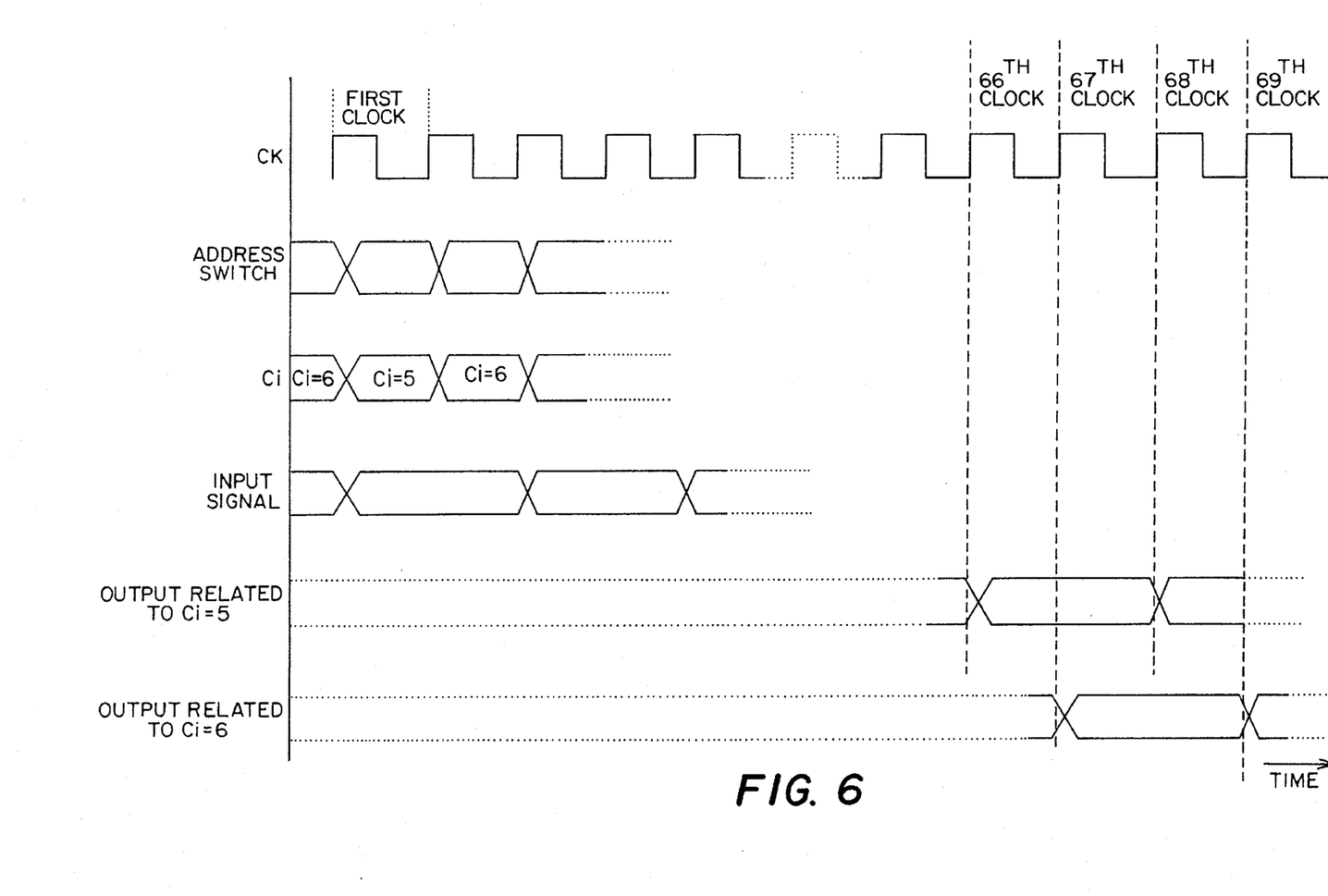
FIG. 6 shows the control signal patterns of the first embodiment of the filtering architecture according to the invention.

FIG. 6 shows a timing diagram of the filter shown in FIG. 5. It should be noted that the filter operates using a clock signal CK having a rate which is twice as fast as the input sample rate so as to enable two alternate filtering modes to be applied to the input signal data. An address switch and control signal alternate for each clock cycle so as to allow filtering of the input signal on a different filtering modes. The subsequent outputs of the filter, occurring after a certain number (e.g., 65) of multiplying accumulate operations which are common in these filters, are then provided. The output related to the first filtering operation is provided one clock cycle before the output related to the second filtering operation. By applying the output related to the first filtering operation to a delay circuit, the outputs of both filtering operations can be properly phased and added together to provide the final output signal.

Figure 7:
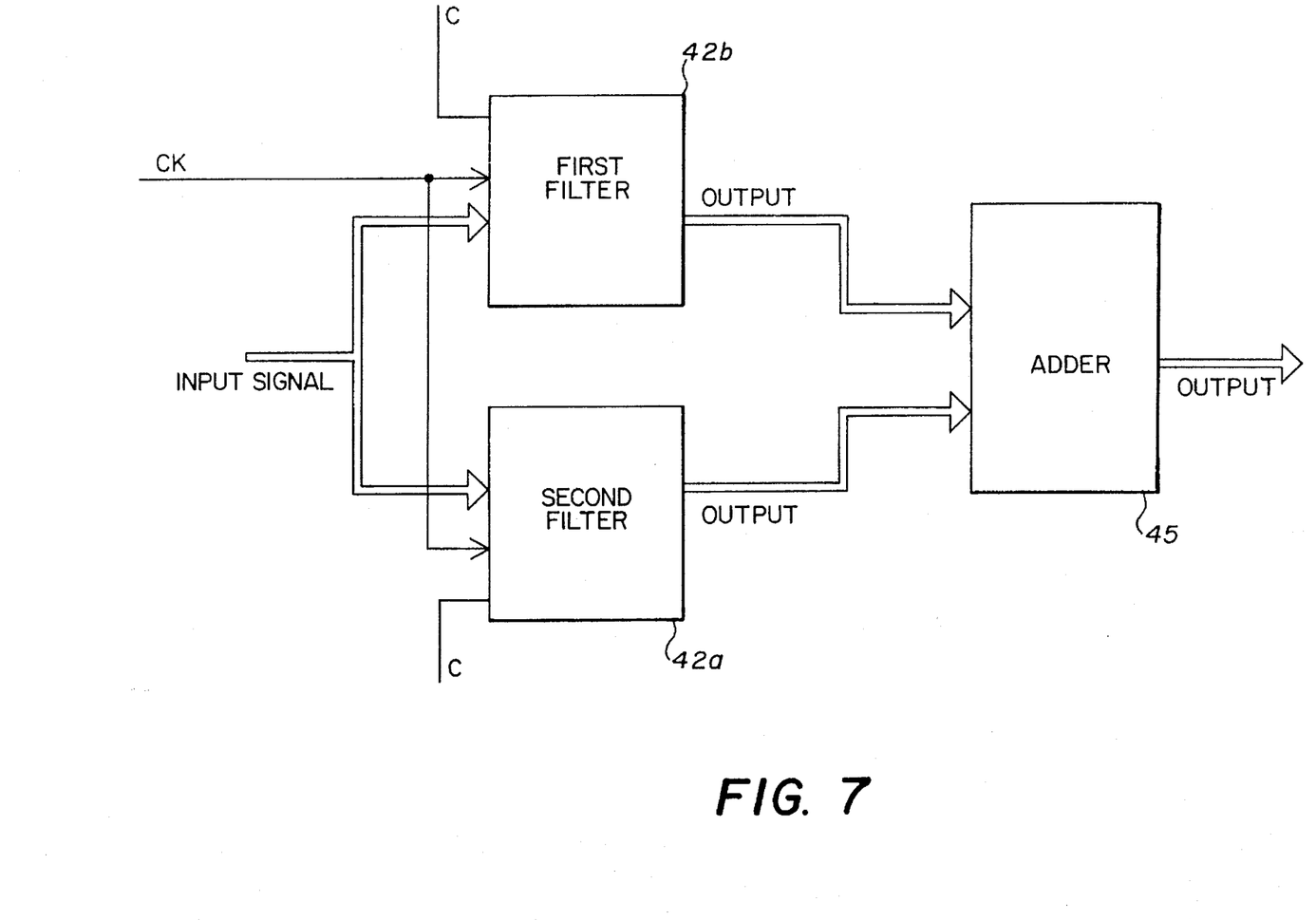
FIG. 7 is a block diagram of a second embodiment of the filter architecture according to the invention.

For further illustration, the example shown in FIG. 7, wherein the input signal is 8 bits, will now be discussed.

From formula (2) above, it may be deduced that two filters 42 are required here, as against the four as required by the prior art in FIG. 1. More particularly, the structure depicted in FIG. 7 is a simplification of FIG. 5, wherefrom the switch 43 and delay line 44 can be omitted on account of the special functionality of the filter 42 being tied to the timing of the output signal y(n).

Also brought forth is the fact that the signal CK is used no longer for switching between the first and second filtering selections (between type 6 and type 7), the first filter 42 constantly operates in the first filtering mode (e.g., type 6) and the second filter 42 is constantly selected for filtering in the second mode (e.g., type 7).

Having now described a few embodiments of the invention, it should be apparent to those skilled in the art that the foregoing is merely illustrative and not limiting, having been presented by way of example only. Numerous modifications and other embodiments are within the scope of one of ordinary skill in the art and are contemplated as falling within the scope of the invention as defined by the appended claims.

What is claimed is:

1. A method for filtering art input digital signal having a high dynamic range to obtain an output digital signal, comprising the steps of:

generating a clock signal having pairs of alternating high and low values;

a first step of filtering the input digital signal using a first filtering operation to provide a first filtered signal for each high value in the clock signal;

a second step of filtering the input digital signal using a second filtering operation different from the first filtering operation to provide a second filtered signal for each low value in the clock signal;

summing the first and second filtered signals from the first and second filtering operations for each pair of high and low values in the clock signal to provide the output digital signal;

wherein the first and second steps of filtering are performed using a single programmable digital filter comprising a memory having address inputs connected to receive the input digital signal and the clock signal and wherein products, of all possible input digital signals and coefficients related to an impulse response for the first and second filtering operations, are stored and wherein the first and second filtering operations are selected by applying the clock signal to one of the address inputs of the memory; and wherein the first and second filtered signals of the first and second filtering operations are presented at the outputs of the programmable filter alternately in time division according to the clock signal.

2. The method of claim 1, further comprising the step of phasing the first and second filtered signals before the step of summing.

3. The method of claim 1 wherein the first filtering operation is filtering with an even symmetric FIR filter with middle coefficient, and every second coefficient equal to zero, and wherein the second filtering operation uses an even symmetric FIR filter without middle coefficient, and every second coefficient equal to zero.

4. A digital filter for filtering an input digital signal to obtain an output digital signal, comprising:

a programmable digital filter having first and second alternately selectable and different filtering modes, an input adapted to receive the input digital signal and an output which provides an output signal, comprising a single memory structure having address inputs defining locations wherein products, of all possible input signals and coefficients related to an impulse response for each filtering operation, are stored and are accessible by addressing the memory with the input digital signal, and wherein the alternately selectable and different filtering modes are selected by a clock signal applied to one of the address inputs of the memory;

means for causing the programmable digital filter to provide a first filtered signal as an output signal from the input digital signal using the first filtering model;

means for causing the programmable digital filter to provide a second filtered signal as an output signal from the input digital signal using the second filtering mode;

a switch, controlled by the clock signal, for delaying the first filtered signal and for directing the delayed signal to a first output and for directing the second filtered signal to a second output, according to the clock signal; and an adder having a first input for receiving the first filtered signal from the first output of the switch and a second input for receiving the second filtered signal from the second output of the switch and for adding the first filtered signal and the second filtered signal to obtain the output digital signal.

5. The digital filter of claim 4, wherein the storage structure is addressable cyclically in accordance with a selected sequence of filtering operations.

6. The digital filter of claim 5, wherein a rate of the selected sequence of filtering operations and addressing of the storage structure is n times the input sampling rate, where n is a positive integer representing a number of filtering operations to be performed.

7. The digital filter of claim 6, wherein the output signals obtained from the storage structure for the different filtering operations are phased using a delay circuit and are provided to inputs of an adder circuit to provide full filter response.

8. A digital filter for filtering an input digital signal to obtain an output digital signal, comprising:

a programmable filter comprising a single memory structure having address inputs connected to receive the input digital signal and a clock signal, and wherein products, of all possible input signals and coefficients related to an impulse response for first and second filtering operations, arc stored at addresses defined by the input digital signals, and wherein the programmable filter outputs the products of to the input digital signal and the coefficients of the first filtering operation when the clock signal is in a first state and outputs the products of to the input digital signal and the coefficients of the second filtering operation when the clock signal is in a second state;

a switch having an input connected to receive the output of the programmable filter and an input connected to receive the clock signal and a first output which provides the input of the switch when the clock signal is in a first state and a second output which provides the input of the switch when the clock signal is in a second state;

a delay connected to the first output of the switch for delaying the first output; and an adder having a first input connected to the delay and a second input connected to the second output of the switch and an output providing the sum of the first and second inputs as the output digital signal of the digital filter.

* * * * *